United States Patent [19]

Privas

[11] 4,196,029
[45] Apr. 1, 1980

[54] PROCESS FOR DEPOSITING A CONDUCTING METAL LAYER ON AN INSULATING SUPPORT

[75] Inventor: Yves E. Privas, Killowen-Blarney, Ireland

[73] Assignee: Panoduz Anstalt, Vaduz, Liechtenstein

[21] Appl. No.: 879,855

[22] Filed: Feb. 22, 1978

[30] Foreign Application Priority Data

Feb. 22, 1977 [FR] France .................. 77 05050

[51] Int. Cl.² .................. B32B 31/26; B05D 3/10
[52] U.S. Cl. .................. 156/89; 156/155; 156/237; 156/239; 427/98; 427/123; 427/125; 427/271; 427/277; 427/278; 427/305; 427/357; 427/367; 427/368
[58] Field of Search .......... 427/98, 304, 305, 368, 427/357, 367, 271, 277, 278, 123, 125; 156/89, 155, 237, 239

[56] References Cited

U.S. PATENT DOCUMENTS

| | | | |
|---|---|---|---|
| 3,226,256 | 12/1965 | Schneble | 427/98 |
| 3,399,268 | 8/1968 | Schneble | 427/98 |
| 3,424,658 | 1/1969 | Norton | 427/98 |
| 3,763,004 | 10/1973 | Wainer | 427/98 |
| 3,772,075 | 11/1973 | Tarnopol | 427/98 |

*Primary Examiner*—Michael F. Esposito
*Attorney, Agent, or Firm*—Jacobs & Jacobs

[57] ABSTRACT

Process for depositing a thin conducting metal layer on an insulating support comprising the steps of applying on said support a layer of nonconducting ink loaded with a powder of metal, alloy or metallic derivative, heating said support and said layer to harden said ink layer, treating the surface of said layer so as to lay the particles forming said powder bare and immersing said thus coated support into a bath containing, in the form of particles, the conducting metal to be deposited, under conditions which are known per se and such that said conducting metal particles are deposited on the powder particles laid bare, wherein is used as insulating support a support made of an inorganic material provided with an enamel coating and the ink used being a compound formed of an enamel and a carrier, the melting point of said enamel being substantially equal to, and preferably slightly lower than, the softening point of the outer layer of said coating.

5 Claims, No Drawings

PROCESS FOR DEPOSITING A CONDUCTING METAL LAYER ON AN INSULATING SUPPORT

The present invention relates to a process for depositing a thin conducting metal layer on an insulating support, in particular for making printed circuits. A process is already known, disclosed in French Patent No 1,237,098, wherein a layer of non conducting ink loaded with a powder of metal, alloy or metallic derivative is applied on the support, then heated in order to harden the ink, the surface of the ink layer being treated so as to lay the particles forming said powder bare, and the support thus coated is immersed into a bath containing, in the form of particles, the conducting metal to be deposited, under conditions which are known per se and such that said conducting metal particles are deposited on the powder particles laid bare.

In the usual ways of performing this process, a glass and resin laminate is used as insulating support, the resin being a thermostable resin such as silicone or polyimide, and the ink being also a thermo-stable resin such as silicone or polyimide.

The use of plastic materials for the support limits however the operating temperatures of the circuit obtained and its resistance to ageing.

Moreover, it is desirable to be able to form printed circuits, resisting or not, on supports currently used in the branch of electric household appliances such as on steel or aluminium sheets, glass, etc.

The object of the present invention is therefore a process of the aforementioned type, characterized in that there is used as insulating support a support made of an inorganic material provided with an enamel coating and the ink used being a compound formed of an enamel and a carrier, the melting point of said enamel being substantially equal to, and preferably slightly lower than, the softening point of the outer layer of said coating. The use of an enamel for forming the ink permits using as support enamelled metallic sheets or glasses or enamelled ceramics. Said supports exibit the advantage of having a robustness, a resistance to ageing and a thermal stability which are obviously very high.

The deposit of the conducting metal is preferably carried out according to the so-called "electroless" chemical deposit process which does not use electricity.

The proportion of powdered metal in the ink, after baking the enamel, is advantageously comprised between 60 and 90% by weight, the proportion of enamel being then of 10–40% by weight.

A high proportion of powdered metal is in fact necessary for reaching a high density of the metallic particles, said high density favouring a uniform deposit of the conducting metal.

This high proportion, and the density generally high of the metals, lead to the fact that the outer layer of the support coating has to have a softening point of the same order, preferably slightly superior to the melting point of the ink enamel. In fact if the coating were to become soft in a notable manner while the ink was being baked, the powdered metal would penetrate into the coating and cause cracks, and the electrical insulation characteristics of the coating would be seriously impaired.

As regards the carrier, an oil which is habitually used to this effects is employed, in a proportion such that the ink obtained is in the form of a fluid compound usable with the silk-screen process. This proportion depends on the specific surface of the powdered metal used, a high specific surface requiring a large quantity of oil.

The powdered metal must exhibit a relatively high resistivity so as not to modify the electrical characteristics of the final printed circuit. On the other hand, the metal of said powder has to be chosen such that the deposit of conducting metal through the "electroless" process is carried out under the most favourable conditions. In principle, a metal is chosen whose electrolytic potential $E_o$ is high relative to that of the conducting metal. However, one may also use the same metal as the conducting metal, notably in the case of nickel.

As examples of powdered metals, one can mention in particular the powders of cobalt-nickel or iron, with particle size comprised between 1 and 10 $\mu$m.

Preferably, particles of spongy or angular shape will be used, since such shapes provide a good mutual bonding of the particles which provides them with a better resistance to the treatment necessary for laying the particles bare, carried out through sand blasting, brushing or chemical attack. Moreover, said particle shapes favour the obtention of a high density which, as has been seen, is advantageous.

The conducting metal chosen for making the printed circuit is selected of course in relation with the considered application. If the circuit has to have a high resistance, and is intended for use in heating, a high resistivity metal will be chosen such as nickel. If on the contrary a low resistance circuit is required, intended for instance for establishing connections, a low conductive metal will be chosen such as copper or silver.

The enamel coating applied on the support is of great importance since, further to its standard functions of protecting the support and giving it a good appearance, it has to permit the adherence of the ink layer and provide the electrical insulation between support and printed circuit when the support is itself conductive.

Of course, the enamel coating is chosen primarily as a function of the support characteristics: melting point, thermal expansion coefficient, resistivity, surface state, chemical nature.

The structure and characteristics of the enamel coating will now be described in the case where the support is a steel (or copper) sheet, an aluminum sheet, or a glass sheet (or also a ceramic or a borosilicate sheet).

When the support is a normal steel sheet, a mass layer has to be provided with a very blistered structure for easing the removal of gas from the sheet when being baked. Said mass being therefore little insulating, upper layers of very high resistivity have to be provided.

On the other hand, the linear expansion coefficients have to decrease from the metal sheet to the covering layer so that the coating be in compression relative to the sheet.

Such conditions being taken into account, there will be applied in succession on the metal sheet, which has a linear expansion coefficient $\lambda$, measured between 20° and 320° C., of $140.10^{-7}$, a standard mass with a coefficient $\lambda = 100.10^{-7}$ and a thickness of 10 to 12 $\mu$m, an insulating mass, with a coefficient $\lambda = 85.10^{-7}$, and a thickness of 40 $\mu$m, an insulating coating enamel, with a coefficient $\lambda = 80.10^{-7}$ and a thickness between 100 and 150 $\mu$m.

If a decarburized sheet is used, one may advantageously omit the first mass layer and apply only the insulating mass and the covering enamel.

The man of the art will have no difficulty in selecting, considering the application in question, enamels having the hereabove characteristics. It will be only mentioned that one can use as coating enamel the enamel sold under the trademark MAJOLIQUE by the "Procédés Ferro" Company, with a softening point lying between 600° and 650° C.

The enamel of the corresponding ink will have a melting point of the same order, that is of about 600° C.

In the case of a stainless steel sheet, the mass layer becomes unnecessary, as in the case of the decarburized steel sheet, since there is no gaz to be removed.

What has just been mentioned for steel is equally valid in essence for copper.

The applications to consider for enamelled steel sheets carrying a printed cicuit are numerous in the household appliances branch. Amongst others, cooker plates can be mentioned.

When the support is aluminium, a mass layer is no more necessary if an aluminium of the so-called "enamelling" type is used.

Enamels have to be used which melt at a lower temperature since the melting point of aluminium is very low. Enamels will then be used with a softening point of about 460° C., the melting point of the ink enamel being then of about 480° C.

The expansion coefficient $\lambda$ of aluminium being of $240.10^{-7}$, a system will be used with two coating layers comprising a normal enamelling layer for aluminium, with a coefficient $\lambda = 185.10^{-7}$, and a thickness of about 15 $\mu$m, and an insulating enamel layer with a coefficient $\lambda = 180.10^{-7}$ and a thickness of about 30 $\mu$m, the latter being the outer layer.

Aluminium exhibits a thermal conductibility higher than that of steel, and this makes it interesting in a number of applications.

The use of a glass sheet, of a borosilicate sheet, or of a ceramic sheet as support creates other problems as said materials are very insulating, very refractory and have expansion coefficients $\lambda$ which are very low, i.e. $32.10^{-7}$ in the case of Pyrex glass (registered trademark) and up to $8.10^{-7}$ in the case of ceramics.

In the case of Pyrex glass, a single layer will be used, formed of an enamel appropriate for Pyrex glass, with a coefficient $\lambda = 38.10^{-7}$. The evolution of the expansion coefficients is therefore the reverse of that which is foreseen when the support is a metal, and it is glass which is in compression relative to the enamel.

As regards the selective application of the ink loaded with powdered metal onto the enamelled support, one may use the silk-screen process directly on the support, the pervious areas of the screen corresponding to the lay-out of the required printed circuit.

A more advantageous process consists however in making a transfer picture. For so doing, a selective deposit of the loaded ink is made on a tracing paper impregnated with starch, the deposit being carried out according to the silkscreen process.

After drying, at a temperature lower than 100° C., intended to fix the drawing on the tracing paper, a continuous film of varnish is applied above the ink. The ink deposit is thereby trapped sandwich-like between the tracing paper and the varnish film.

In order to provide transfer of the ink onto the support, the tracing paper is removed by dipping in into water, the varnish film playing then the role of support for the ink deposit, and the ink deposit is applied onto the support. The material is then baked. The varnish disappears during baking through sublimation and there only remains the enamel loaded with the powdered metal which bonds together with the coating enamel of the support.

This process offers the following advantages: it provides the possibility of making deposits in areas which are not accessible with the direct silk-screen process, for instance at the bottom of a hollow support; it provides a regular deposit on bulging or irregular surfaces and it does away with the handling of the supports which was necessary with the direct silk-screen process.

Moreover, the process can be used for applying the enamel coating onto the support. In this case, it is enough to apply the enamel layer or layers onto the tracing paper and to dry them without cooking them, then to provide the selective ink deposit on the dry coating and to proceed thereafter as previously. The cooking of the enamel loaded with metal powder is carried out at the same time as the cooking of the enamel coating of the support, which considerably simplifies the operations.

EXAMPLE

MANUFACTURE OF A HEATED EATING PLATE (a) Enamelling of the metal sheet.

An eating plate made of a steel sheet of the enamelling type, with a low carbon content and a thickness of 1.2 mm, is degreased in a trichloroethylene bath.

A first layer of 150$\mu$ in thickness of refractory white, made of a frit at 100% containing clay as suspension agent in the proportion of 4.5% and sodium nitrate as electrolyte in the proportion of 0.3% is applied by spraying with a spray gun according to the wet process.

The plate is dryed at 80° C. for 10 minutes and heated in a continuous enamel baking oven at 850° C. for 5 minutes.

Using the same process, a layer of 300$\mu$ in the thickness of MAJOLIQUE enamel (a product of the "Procédés Ferro" Company) containing also clay and sodium nitrate in the same proportions and a metallic oxide as colorant in the proportion of 1.5% is applied according to the same process. It is then dried at 80° C. and the baking is carried out under the same conditions as for the first layer.

(b) Deposit of the drawing on the metal sheet.

A mixture is prepared which is composed of 80% of nickel prismatic particles of a size of 2–5 $\mu$m, and of 20% of enamel frit with an expansion coefficient $\lambda$ of $70 \times 10^{-7}$. The mixture is kneaded with a screen-silk oil and a silk-screen solvent with a boiling point of about 100° C. A compound is thereby obtained which is applied by the silk-screen process onto a transfer picture blotting paper, according to the layout of the required circuit.

The solvent is evaporated by heating at 100° C. and a film of plastic material curing at 100° C. is applied again with the silk-screen process on the whole surface of the paper over the compound, and the material is then heated between 100° and 120° C. for hardening the plastic film.

The paper thus coated is dipped into water for removing the blotting paper from the plastic film and from the compound, and then the circuit is laid, on the side of the compound, on the enamelled side of the eating plate by expelling the water still trapped between the film and the circuit.

A drying operation is carried out at 90° C. for 10 minutes, then a baking operation at 850° C. for 5 minutes. The plastic film is sublimated and the lay-out of the circuit is integrated into the enamel of the metal sheet.

(c) Realization of the circuit.

A mechanical activation of the surface of the metal sheet is carried out for laying bare the nickel particles embedded into the enamel. For so doing, the metal sheet is subjected to a micro sand blasting using the wet process (water-blast) by utilizing a water and silica bath containing 30 parts of silica by weight for 100 parts of water. The water-blast is carried out at a projection distance of 20 cm and an air pressure of 3 bar.

The eating plate is then immersed into a hydrochloric bath for chemical activation, then rinsed, then dipped finally into a chemical nickel bath of the Shipley type. A heating circuit deposited on an enamelled steel sheet is thereby obtained.

What I claim is:

1. A method of manufacturing a pattern of electroconductive metal deposited on an enameled substrate which comprises applying an ink composition to said enameled substrate in accordance with said pattern, said ink composition comprising a second enamel and a metal-containing powder receptive to electroless plating, said second enamel having a melting point no greater than the softening point of the enamel of said enameled substrate and said metal-containing powder being present in an amount sufficient to provide from 60 to 90% by weight of said ink composition after baking; baking said composition; treating said baked composition so as to expose particles of said metal containing powder; and subjecting the baked, exposed composition to electroless plating.

2. The method according to claim 1 wherein the metal-containing powder is nickel-cobalt or iron.

3. The method according to claim 1 wherein the particles of powder are of a spongy or angular shape.

4. A method of manufacturing a pattern of electroconductive metal deposited on an enameled substrate which comprises applying an ink composition to a water disintegrable surface in accordance with said pattern, said composition comprising a second enamel and a metal-containing powder receptive to electroless plating, said second enamel having a melting point no greater than the softening point of the enamel on said substrate and said metal-containing powder being present in an amount sufficient to provide from 60 to 90% by weight of said composition after baking; drying said ink composition, coating said dried composition and said water disintegrable surface with a sublimable varnish film; disintegrating said water disintegrable surface whereby said dried composition remains on said film; applying said film to said enameled substrate; baking said enameled substrate with the applied film whereby said film sublimes; treating said baked composition so as to expose particles of said metal-containing powder; and subjecting the baked exposed composition to electroless plating.

5. A method of manufacturing a pattern of electroconductive metal deposited on an enameled substrate which comprises applying a first enamel on a water disintegrable surface to provide a first enameled coating; applying an ink composition to said enameled coating in accordance with said pattern, said ink composition comprising a second enamel and a metal-containing powder receptive to electroless plating, said second enamel having a melting point no greater than the softening point of said first enamel and said metal-containing powder being present in an amount sufficient to provide from 60 to 90% by weight of said composition after baking; drying said ink composition; coating said ink composition and said first enameled coating with a sublimable varnish film; disintegrating said water disintegrable surface thereby leaving a laminate of said first enameled coating, said ink composition and said film; applying said laminate to an unenameled substrate; baking said substrate and laminate; treating said baked composition so as to expose particles of said metal-containing powder; and subjecting the baked, exposed composition to electroless plating.

* * * * *